(12) United States Patent
Wu et al.

(10) Patent No.: US 11,403,869 B2
(45) Date of Patent: Aug. 2, 2022

(54) OPTICAL FINGERPRINT IDENTIFICATION APPARATUS AND ELECTRONIC DEVICE

(71) Applicant: SHENZHEN GOODIX TECHNOLOGY CO., LTD., Shenzhen (CN)

(72) Inventors: Baoquan Wu, Shenzhen (CN); Sichao Zhang, Shenzhen (CN); Wei Long, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 381 days.

(21) Appl. No.: 16/693,341

(22) Filed: Nov. 24, 2019

(65) Prior Publication Data
US 2020/0327296 A1 Oct. 15, 2020

Related U.S. Application Data

(63) Continuation of application No. PCT/CN2019/100657, filed on Aug. 14, 2019.

(30) Foreign Application Priority Data

Apr. 10, 2019 (CN) .......................... 201920480285.1

(51) Int. Cl.
*G06V 40/13* (2022.01)
*G02B 3/00* (2006.01)
(Continued)

(52) U.S. Cl.
CPC ....... *G06V 40/1318* (2022.01); *G02B 3/0056* (2013.01); *H01L 24/48* (2013.01);
(Continued)

(58) Field of Classification Search
CPC .... G06V 40/1318; G02B 3/0056; G02B 5/20; H01L 24/48; H01L 27/1462;
(Continued)

(56) References Cited

U.S. PATENT DOCUMENTS 6,344,263 B1 * 2/2002 Moshrefzadeh ..... G03B 21/625
428/209
9,177,190 B1 11/2015 Chou et al.
(Continued)

FOREIGN PATENT DOCUMENTS

CN 106847872 A 6/2017
CN 107437055 A 12/2017
(Continued)

OTHER PUBLICATIONS

Williams, C. et al., "Single-step fabrication of thin-film linear variable bandpass filters based on metal-insulator-metal geometry", Applied Optics, Nov. 9, 2016, pp. 9237-9241, vol. 55, No. 32.
(Continued)

*Primary Examiner* — Antonio Xavier
(74) *Attorney, Agent, or Firm* — Scully Scott Murphy & Presser

(57) ABSTRACT

An embodiment of the present application discloses an optical fingerprint identification apparatus and an electronic device, which can improve performance of the optical fingerprint identification apparatus. The optical fingerprint identification apparatus includes: a light detection array; a filter layer, disposed above the light detection array, where the filter layer is integrated with the light detection array in a photosensor chip; a first light blocking layer formed above the filter layer, where the first light blocking layer is provided with a plurality of light passing holes; and a first microlens array disposed above the first light blocking layer, where the first microlens array is configured to converge the (Continued)

optical signal to the plurality of light passing holes of the first light blocking layer, and the optical signal is transmitted to the light detection array through the plurality of light passing holes of the first light blocking layer.

20 Claims, 6 Drawing Sheets

(51) Int. Cl.
  *H01L 23/00* (2006.01)
  *H01L 27/146* (2006.01)
  *G02B 5/20* (2006.01)
(52) U.S. Cl.
  CPC .... *H01L 27/1462* (2013.01); *H01L 27/14623* (2013.01); *H01L 27/14627* (2013.01); *H01L 27/14636* (2013.01); *H01L 27/14678* (2013.01); *G02B 5/20* (2013.01); *H01L 2224/48091* (2013.01); *H01L 2224/48106* (2013.01); *H01L 2224/48227* (2013.01)
(58) Field of Classification Search
  CPC ......... H01L 27/14623; H01L 27/14627; H01L 27/14636; H01L 27/14678; H01L 2224/48091; H01L 2224/48227
  See application file for complete search history.

(56) References Cited

U.S. PATENT DOCUMENTS

| | | | | |
|---|---|---|---|---|
| 2008/0144192 | A1* | 6/2008 | Choi | G02B 3/0075 264/1.36 |
| 2009/0128043 | A1* | 5/2009 | Wang | H05B 45/22 257/431 |
| 2009/0225205 | A1* | 9/2009 | Takagi | H01L 27/14685 348/294 |
| 2014/0140588 | A1* | 5/2014 | Chou | G06V 40/1306 382/124 |
| 2016/0234480 | A1* | 8/2016 | Lee | H04N 13/305 |
| 2016/0254312 | A1* | 9/2016 | Lee | H01L 27/14687 382/125 |
| 2017/0202093 | A1* | 7/2017 | Bang | H05K 5/0086 |
| 2017/0243046 | A1* | 8/2017 | Chang | H01L 23/10 |
| 2017/0286743 | A1 | 10/2017 | Lee et al. | |
| 2017/0344792 | A1* | 11/2017 | Yang | H05K 3/0044 |
| 2017/0357838 | A1* | 12/2017 | Chen | G06V 40/1329 |
| 2018/0209616 | A1* | 7/2018 | Lee | H05K 1/0203 |
| 2018/0233531 | A1 | 8/2018 | Huang et al. | |
| 2018/0276444 | A1* | 9/2018 | Sun | G06V 40/1318 |
| 2019/0026523 | A1 | 1/2019 | Shen et al. | |
| 2019/0156094 | A1* | 5/2019 | Du | G06V 40/1318 |
| 2019/0180072 | A1* | 6/2019 | Fomani | G06V 40/1324 |
| 2019/0205592 | A1 | 7/2019 | Cao et al. | |
| 2019/0302914 | A1* | 10/2019 | Zhang | G06F 1/1643 |
| 2019/0355937 | A1* | 11/2019 | Xu | H01L 21/77 |
| 2020/0364433 | A1* | 11/2020 | Kim | G06F 1/1626 |

FOREIGN PATENT DOCUMENTS

| | | |
|---|---|---|
| CN | 107480579 A | 12/2017 |
| CN | 107728240 A | 2/2018 |
| CN | 108010931 A | 5/2018 |
| CN | 108073912 A | 5/2018 |
| CN | 109033926 A | 12/2018 |
| CN | 109416732 A | 3/2019 |
| CN | 109416737 A | 3/2019 |
| CN | 208848221 U | 5/2019 |
| CN | 109983471 A | 7/2019 |
| CN | 209640880 U | 11/2019 |

OTHER PUBLICATIONS

Xuewen Chen et al. "Imaging method based on the combination of microlens arrays and aperture arrays" Applied Optics, vol. 57, No. 19, 10.1364/AO.57.005392, Jun. 28, 2018, 7 pages total.

* cited by examiner

OPTICAL FINGERPRINT IDENTIFICATION APPARATUS AND ELECTRONIC DEVICE

CROSS-REFERENCE TO RELATED APPLICATIONS

This application is a continuation of International Application No. PCT/CN2019/100657, filed on Aug. 14, 2019, which claims priority to Chinese Patent Application No. 201920480285.1, filed on Apr. 10, 2019. The disclosures of the aforementioned applications are hereby incorporated by reference in their entireties.

TECHNICAL FIELD

The present application relates to the field of optical fingerprint technologies, and in particular, to an optical fingerprint identification apparatus and an electronic device.

BACKGROUND

With the advent of the era of a full-screen mobile phone, the application of an under-display fingerprint identification apparatus is more and more widely, among which an under-display optical fingerprint identification apparatus is most popular. At present, the under-display optical fingerprint identification apparatus that enjoys mass production in the industry mainly adopts two solutions. One is to adopt a small hole imaging. In actual industrial production, the size of the small hole cannot be further reduced, thereby limiting improvement of resolution of a fingerprint image. Besides, the small hole only allows incident light in the perpendicular direction to enter, failing to provide sufficient light which causes a relatively limited imaging signal, and affecting the quality of the fingerprint image. The other is to adopt an optical lens, which uses a spherical or aspherical lens for converging light and imaging. Under the development trend of sliming the mobile phone, there is a short distance from a finger-pressing screen surface of the mobile phone to a fingerprint acquisition region of an optical chip, and a total optical thickness of the optical lens is small. Therefore, a fingerprint acquisition area is very limited, failing to perform large-area fingerprint acquisition, which affects performance of the fingerprint identification apparatus.

Therefore, how to improve the performance of the under-display optical fingerprint identification apparatus becomes an urgent problem to be solved.

SUMMARY

An embodiment of the present application provides an optical fingerprint identification apparatus and an electronic device, which may improve performance of the optical fingerprint identification apparatus.

In a first aspect, provided is an optical fingerprint identification apparatus, including:

a light detection array;

a filter layer, disposed above the light detection array, for filtering out an optical signal of a non-target band, and transmitting an optical signal of a target band, where the filter layer is integrated with the light detection array in a photosensor chip;

a first light blocking layer formed above the filter layer, where the first light blocking layer is provided with a plurality of light passing holes;

a first microlens array disposed above the first light blocking layer, where the first microlens array is configured to converge an optical signal to the plurality of light passing holes of the first light blocking layer, and the optical signal is transmitted to the light detection array through the plurality of light passing holes of the first light blocking layer.

In a technical solution of an embodiment of the present application, the first light blocking layer is grown on the light detection array as a whole, and the plurality of light passing holes are disposed on the first light blocking layer, the optical signal is converged by the first microlens array to the plurality of light passing holes, and the optical signal is transmitted to the light detection array through the plurality of light passing holes for optical fingerprint acquisition. So a thickness of the fingerprint identification apparatus is reduced while large-area and high-resolution fingerprint identification image is achieved; and the filter layer is integrated with the light detection array in the photosensor chip, which may further reduce the thickness of the fingerprint identification apparatus, thereby improving the performance of the optical fingerprint identification apparatus.

In a possible implementation, the optical fingerprint identification apparatus further includes: a first medium layer and a second medium layer;

the first medium layer is grown on a surface of the filter layer;

the first light blocking layer is grown on a surface of the first medium layer; and the second medium layer is grown on a surface of the first light blocking layer and fills the plurality of light passing holes of the first light blocking layer.

In a possible implementation, all of an upper surface of the first microlens array is a light-converging region, and the light-converging region of the first microlens array covers a photosensitive region of the light detection array.

In a possible implementation, the first microlens array includes a plurality of microlenses, and the light detection array includes a plurality of pixel units, where a first microlens in the plurality of microlenses of the first microlens array is configured to converge a first optical signal from above the first microlens to a first light passing hole corresponding to the first microlens in light passing holes of the first light blocking layer, and the first optical signal is transmitted to a first pixel unit corresponding to the first microlens in the plurality of pixel units through the first light passing hole.

In a possible implementation, the optical signal is an optical signal in a first specific direction, a line direction of an optical center of the first microlens and a center of the first light passing hole is the same as or similar to the first specific direction, and a line direction of the center of the first light passing hole and a center of the first pixel unit is the same as or similar to the first specific direction.

In a possible implementation, the first specific direction is perpendicular to the light detection array.

In a possible implementation, the first specific direction is oblique to the light detection array.

In a possible implementation, a ratio of an area of an orthographic projection of the first microlens on the light detection array to an area of the first pixel unit is greater than 70%.

In a possible implementation, the first microlens is a quadrangular microlens.

In a possible implementation, an orthographic projection of the first microlens on the light detection array overlaps with the first pixel unit.

In a possible implementation, an upper surface of the first microlens is a spherical surface or an aspherical surface.

In a possible implementation, the light passing hole is a circular hole having a diameter less than 10 μm.

In a possible implementation, the optical fingerprint identification apparatus includes a plurality of layers of the first light blocking layer.

In a possible implementation, the second medium layer is disposed both between the plurality of layers of the first light blocking layer and between the first light blocking layer disposed on a topmost layer and the first microlens array, and the first light blocking layer and the second medium layer are sequentially grown by a growth process; and the second medium layer fills the plurality of light passing holes of the first light blocking layer.

In a possible implementation, a diameter of the light passing hole of the first light blocking layer on an upper layer is greater than a diameter of the light passing hole of the first light blocking layer on a lower layer.

In a possible implementation, the optical signal is an optical signal in a second specific direction, a line direction of a center of a light passing hole of the first light blocking layer on the upper layer and a center of a corresponding light passing hole of the first light blocking layer on the lower layer is the same as or similar to the second specific direction; and a line direction of the center of a light passing hole of the first light blocking layer on the upper layer and a center of a corresponding pixel unit in the light detection array is the same as or similar to the second specific direction.

In a possible implementation, a wavelength range of the target band includes 350-700 nm and/or 800-1000 nm.

In a possible implementation, a thickness of the filter layer is smaller than or equal to 20 μm.

In a possible implementation, the optical fingerprint identification apparatus further includes a circuit board electrically connected with a light detection portion of the optical fingerprint identification apparatus through an electrical connection apparatus.

In a possible implementation, the light detection portion is provided with a metal pad, and the electrical connection apparatus is electrically connected with the optical fingerprint identification apparatus through the metal pad.

In a possible implementation, the circuit board is a flexible circuit board, and the electrical connection apparatus is a solder, an anisotropic conductive film or a metal connection apparatus.

In a possible implementation, the circuit board is a printed circuit board, and the electrical connection apparatus is a wire bonding apparatus.

In a possible implementation, the printed circuit board is disposed below the light detection portion, or parallel with the light detection portion.

In a second aspect, an electronic device is provided, including: a display screen and the optical fingerprint identification apparatus in the first aspect or any possible implementation of the first aspect, where the optical fingerprint identification apparatus is disposed below the display screen.

DESCRIPTION OF EMBODIMENTS

Figure 1:
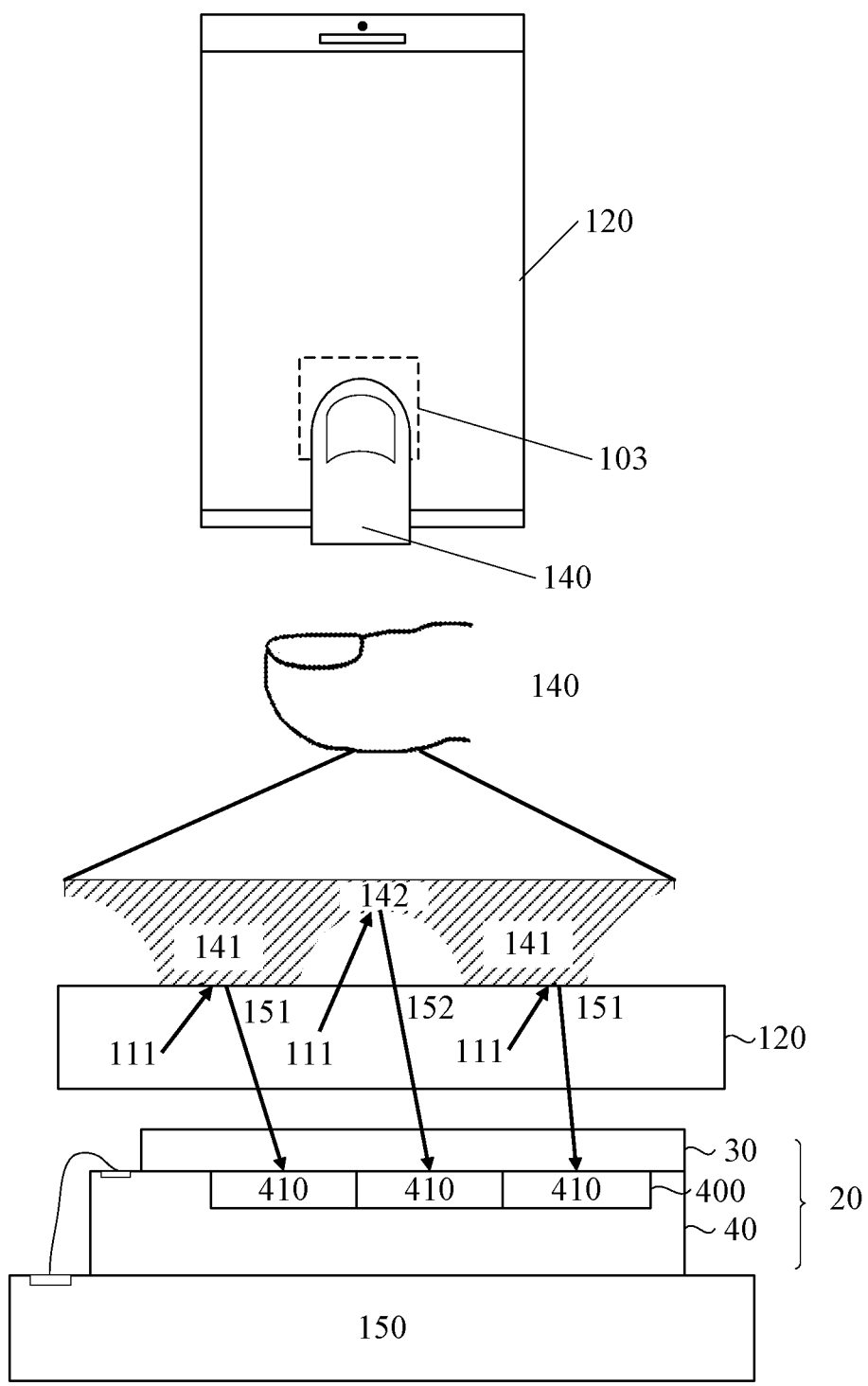
FIG. 1 is a schematic plan view of an electronic device to which an embodiment of the present application is applicable.

Technical solutions in embodiments of the present application will be described hereinafter with reference to accompanying drawings.

It should be noted that in embodiments shown below, the same structures are denoted by the same reference numerals for ease of understanding, and detailed description of the same structures is omitted for brevity.

As a common application scene, an optical fingerprint identification apparatus provided in an embodiments of the present application may be applied to a smart phone, a tablet computer and another mobile terminal having a display screen or another terminal device; and a technical solution of an embodiment of the present application may be applied to a biometric identification technology, where the biometric identification technology includes but is not limited to fingerprint identification, palmprint identification, iris identification, face identification, living body identification and other identification technologies. For convenience of illustration, an example of a fingerprint identification technology is illustrated below.

More specifically, in the above terminal device, the optical fingerprint identification apparatus may be disposed in a partial region or an entire region below a display screen, thereby forming an under-display optical fingerprint system.

FIG. 1 shows a schematic structural diagram of a terminal device applicable to an embodiment of the present application. A terminal device 10 includes a display screen 120 and an optical fingerprint identification apparatus 20, where the optical fingerprint identification apparatus 20 is disposed in a partial region below the display screen 120. The optical fingerprint identification apparatus 20 includes an optical fingerprint sensor which include a light detection array 400 having a plurality of pixel units 410, and a region where the light detection array 400 is located or a sensing region of the light detection array 400 is a fingerprint detection region 103 of the optical fingerprint identification apparatus 20. As shown in FIG. 1, the fingerprint detection region 103 is located in a display region of the display screen 120. In an alternative embodiment, the optical fingerprint identification apparatus 20 may also be disposed at other positions, such as a side of the display screen 120 or an non-light transmitting region of the edge of the terminal device 10, and an optical signal of at least part of the display region of the display screen 120 are guided to the optical fingerprint identification apparatus 20 through an optical path design, such that the fingerprint detection region 103 is actually located in the display region of the display screen 120.

It should be understood that an area of the fingerprint detection region 103 may be different from an area of a sensing array of the optical fingerprint identification apparatus 20. For example, the area of the fingerprint detection region 103 of the optical fingerprint identification apparatus 20 may be larger than the area of the sensing array of the optical fingerprint identification apparatus 20 through the optical path design such as lens imaging, a reflective folding optical path design or other optical path design such as light convergence or reflection. In other alternative implementations, if an optical path is guided in a manner, such as light collimation, the area of the fingerprint detection region 103 of the optical fingerprint identification apparatus 20 may also be designed to be substantially consistent with the area of the sensing array of the optical fingerprint identification apparatus 20.

Therefore, when a user needs to unlock the terminal device or perform other fingerprint verification, fingerprint input may be achieved merely by pressing a finger on the fingerprint detection region 103 located on the display screen 120. Since fingerprint inspection may be achieved under the display, there is no need to specially reserve space for a front surface of the terminal device 10 in the foregoing structure to set a fingerprint button (such as Home button), so that a full screen scheme may be adopted; that is, the display region of the display screen 120 may be substantially extended to the entire front surface of the terminal device 10.

As an optional implementation, as shown in FIG. 1, the optical fingerprint identification apparatus 20 includes an optical component 30 and an optical detection portion 40; the optical detection portion 40 includes the light detection array 400, a reading circuit and other auxiliary circuits electrically connected with the light detection array. The optical detection portion 40 may be fabricated on a chip (Die) such as an optical imaging chip or an optical fingerprint sensor by a semiconductor process. The light detection array is specifically a photo detector array including a plurality of photo detectors arranged in an array, the photo detectors may be used as the pixel unit as described above; and the optical component 30 may be disposed above a sensing array of the optical inspection portion 40.

In a specific implementation, the optical component 30 may be encapsulated with the optical inspection portion 40 in the same optical fingerprint component. For example, the optical component 30 may be encapsulated with the optical inspection portion 40 in the same optical fingerprint chip, or the optical component 30 may be disposed outside a chip where the optical inspection portion 40 is located. For example, the optical component 30 is attached above the chip, or part of element of the optical component 30 are integrated in the chip.

As an optional embodiment, the display screen 120 may adopt a display screen with a self-emitting display unit, such as an organic light emitting diode (OLED) display screen or a micro light emitting diode (Micro-LED) display screen. Taking the application of the OLED display screen as an example, the optical fingerprint identification apparatus 20 may use the display unit (that is, an OLED light source) of the OLED display 120 located in the fingerprint detection region 103 as an excitation light source for optical fingerprint detection. When a finger 140 presses the fingerprint detection region 103, the display screen 120 emits a beam of light 111 to the target finger 140 above the fingerprint detection region 103, and the light 111 is reflected on a surface of the finger 140 to form reflected light or the light 111 is scattered inside the finger 140 to form scattered light. In related patent applications, the above reflected light and scattered light are collectively referred to as reflected light for convenience of description. Since a ridge and a valley of a fingerprint have different light reflecting abilities, reflected light 151 from the ridge of the fingerprint and reflected light 152 from the valley of the fingerprint have different light intensities. After passing through the optical component 30, the reflected light is received by the light detection array 400 in the optical fingerprint identification apparatus 20 and converted into a corresponding electrical signal, that is, a fingerprint inspection signal. Fingerprint image data may be obtained based on the fingerprint inspection signal, and fingerprint matching verification may be further performed, thereby achieving an optical fingerprint identification function at the terminal device 10.

It should be understood that, a circuit board 150, such as a flexible printed circuit (FPC), may also be disposed under the optical fingerprint identification apparatus 20. The optical fingerprint identification apparatus 20 may be bonded to the circuit board 150 by a backside adhesive, and electrically connected with the circuit board 150 by a pad and a mental wire welding. The optical fingerprint identification apparatus 20 may achieve electrical interconnection and signal transmission with other peripheral circuits or other elements of the electronic device 10 through the circuit board 150. For example, the optical fingerprint identification apparatus 20 may receive a control signal of a processing unit of the electronic device 10 through the circuit board 150, and may also output the fingerprint inspection signal from the optical fingerprint identification apparatus 20 to the processing unit, a control unit and the like of the electronic device 10 through the circuit board 150.

It should be understood that, in a specific implementation, the terminal device 10 further includes a transparent protective cover which is located above the display screen 120 and covers the front surface of the terminal device 10 and the cover may be a glass cover or a sapphire cover. Therefore, in an embodiment of the present application, the so-called finger pressing the display screen 120 actually refers to pressing the cover above the display screen 120 or a surface of the protective layer covering the cover.

On the other hand, in some embodiments, the optical fingerprint identification apparatus 20 may include only one optical fingerprint sensor, and in this case, the fingerprint detection region 103 of the optical fingerprint identification apparatus 20 has a small area and a fixed position; therefore, when inputting the fingerprint, the user needs to press the finger on a specific position of the fingerprint detection region 103, otherwise the optical fingerprint identification apparatus 20 may not be able to acquire a fingerprint image, thereby resulting in a poor user experience. In other alternative embodiments, the optical fingerprint identification apparatus 20 may specifically include a plurality of optical fingerprint sensors which may be disposed under the display screen 120 side by side in a splicing manner, and sensing regions of the plurality of optical fingerprint sensors collectively form the fingerprint detection region 103 of the optical fingerprint identification apparatus 20. In other words, the fingerprint detection region 103 of the optical fingerprint identification apparatus 20 may include a plurality of subregions, and each sub-region corresponding to a sensing region of one of the optical fingerprint sensors respectively, so that a fingerprint acquisition region 103 of the optical fingerprint identification apparatus 20 may be extended to a main region of a lower portion of the display screen, that is, extended to a region that is generally pressed by a finger, thereby achieving a blind pressing type of a fingerprint input operation. Alternatively, when the number of the optical fingerprint sensors is sufficient, the fingerprint detection region 103 may also be extended to half of the display region or even the entire display region, thereby achieving half-screen or full-screen fingerprint detection.

It should be noted that the optical fingerprint identification apparatus 20 in an embodiment of the present application may also be referred to as an optical fingerprint identification module, a fingerprint identification apparatus, a fingerprint identification module, a fingerprint module, a fingerprint acquisition apparatus, and the like, and the foregoing terms may be replaced with each other.

Due to requirements of large-area fingerprint identification, a high resolution fingerprint image, a sliming thickness and other factors, there is an increasing demand for a design of the optical fingerprint identification apparatus 20. An embodiment of the present application provides an improved optical fingerprint identification apparatus, which improves resolution of the fingerprint image and reduces the thickness of the fingerprint identification apparatus while collecting fingerprint images in a large area, and further improves the performance of under-display optical fingerprint identification.

Hereinafter, the optical fingerprint identification apparatus according to an embodiment of the present application will be described in detail with reference to FIG. 2 to FIG. 9.

Figure 2:
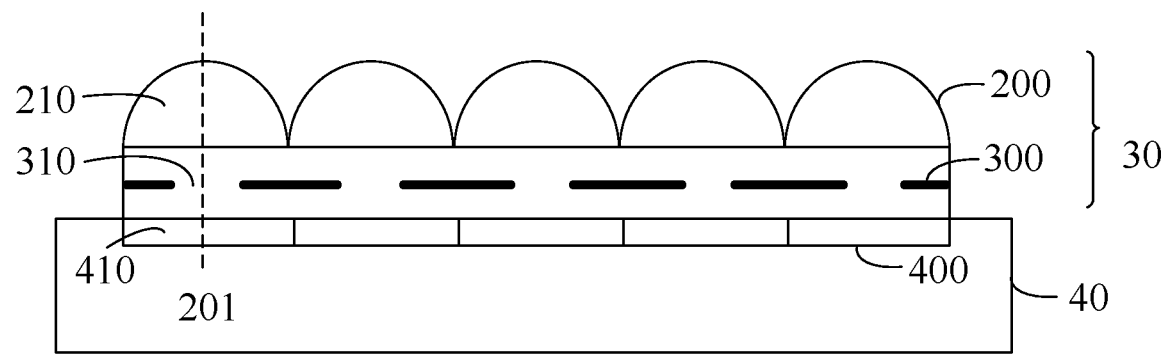
FIG. 2 is a schematic structural diagram of an optical fingerprint identification apparatus provided in an embodiment of the present application.

FIG. 2 is a schematic structural diagram of an optical fingerprint identification apparatus 20 provided in an embodiment of the present application, and the optical fingerprint identification apparatus 20 may include:

a light detection array 400;

a first light blocking layer 300 formed above the light detection array 400, where the first light blocking layer 300 is provided with a plurality of light passing holes; and a first microlens array 200 disposed above the first light blocking layer 300, where the first microlens array 200 is configured to converge an optical signal to the plurality of light passing holes of the first light blocking layer 300, and the optical signal is transmitted to the light detection array 400 through the plurality of light passing holes of the first light blocking layer 300.

Specifically, the optical signal is an optical signal reflected by a finger.

Specifically, the first light blocking layer 300 may be prepared on the light detection array 400 by applying a micro-Nano processing process or a Nano printing process. For example, a layer of film of a non-light transmitting material is prepared above the light detection array 400 through methods such as atomic layer deposition, sputter coating, electron beam evaporation coating and ion beam coating when the micro-Nano processing process is applied; and then small-hole pattern lithography and etching are performed to form a plurality of light passing holes. Optionally, the optical component 30 in FIG. 1 may include the above first microlens array 200 and the first light blocking layer 300.

Figure 3:
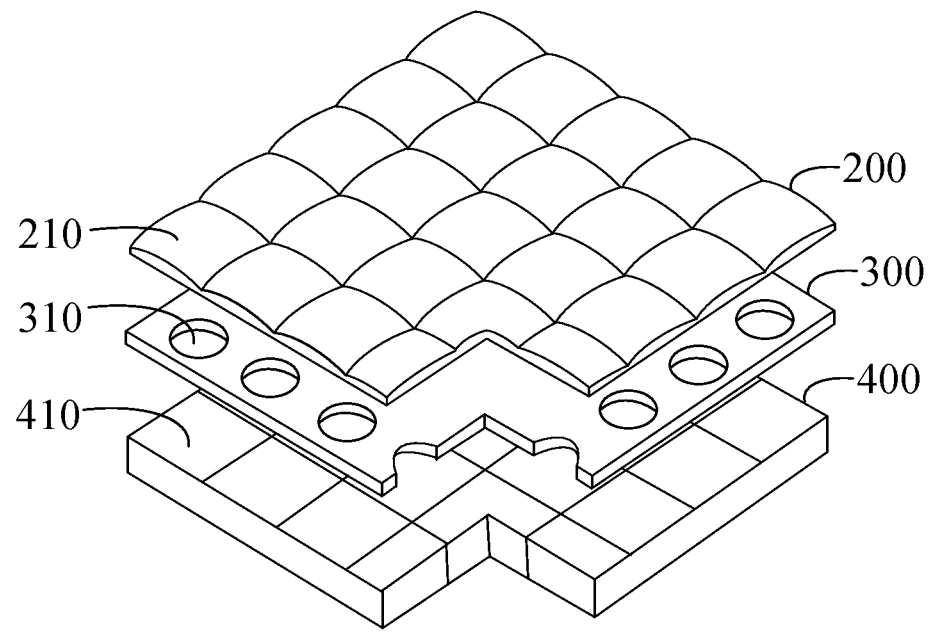
FIG. 3 is a schematic multi-layered stereoscopic structural diagram of an optical fingerprint identification apparatus provided in an embodiment of the present application.

Optically, an upper surface of the first microlens array 200 is a light-converging region, and the light-converging region covers a photosensitive area of the light detection array. FIG. 3 is a schematic multi-layered stereoscopic diagram of the optical fingerprint identification apparatus 20. As shown in FIG. 3, the upper surface of the first microlens array 200 is an array spliced by a plurality of spherical or aspherical surfaces. All regions are curved surfaces and do not include a plane. All regions of the upper surface of the first microlens array 200 can converge light. A photosensitive region in the light detection array 400 is a region that may receive an optical signal. For example, the light detection array 400 is a pixel array in a photosensor, and the photosensitive region of the light detection array 400 is a pixel array region in the photosensor.

Optionally, the first microlens array 200 includes a plurality of microlenses, and the light detection array 400 includes a plurality of pixel units, where a first microlens 210 in the plurality of microlenses is configured to converge a first optical signal from above the first microlens 210 to a first light passing hole 310 corresponding to the first microlens in the light passing hole of the first light blocking layer, and the first optical signal is transmitted to a first pixel unit 410 corresponding to the first microlens 210 in the plurality of pixel units through the first light passing hole 310.

Optionally, a focus of the first microlens 210 is located at any point between the first light blocking layer 300 and the first pixel unit 410.

For example, the focus of the first microlens 210 is located in the first light passing hole 310, or the focus of the first microlens 210 is located on the first pixel unit 410.

Optionally, the first microlens 210 may be configured to converge an optical signal above which is perpendicular to the light detection array 400 to the first light passing hole 310.

Optionally, the first microlens 210 may also be configured to converge an optical signal above of a specific direction to the first light passing hole 310.

Optionally, a surface of the first microlens 210 may be a spherical surface or an aspherical surface.

Optionally, the first microlens 210 is a polygonal lens, such as a square lens or a hexagonal lens. Optically, the first microlens 210 may also be a circular lens. As shown in FIG. 2 and FIG. 3, the first microlens 210 is a quadrangular lens whose upper surface is a spherical surface and whose lower surface is a quadrangle.

Optionally, a material of the first microlens array 200 is a transparent medium with light transmittance greater than 99%, such as a resin and the like.

It should be understood that the first microlens 210 is any one of a plurality of microlenses in the first microlens array 200. An embodiment of the present application does not define a specific position where the first microlens 210 is located in the first microlens array 200.

It should be understood that a shape and size of the plurality of microlenses in the first microlens array 200 may be the same as or different from that of the first microlenses 210. An embodiment of the present application does not define the shape and size of the plurality of microlenses.

Optionally, each microlens of the plurality of microlenses in the first microlens array 200 is the same as the first microlens 210. As shown in FIG. 2 and FIG. 3; each microlens in the first microlens array 200 is a quadrangular microlens; and a plurality of the quadrangular microlenses are arranged in an array on a horizontal plane. In addition, each microlens in the first microlens array 200 may also be a circular microlens or other polygonal microlenses.

In an embodiment of the present application, the optical signal may be transmitted to the light detection array 400 through the plurality of light passing holes of the first light blocking layer 300. The first light blocking layer 300 is configured to block ambient light, stray light and other optical signals which interfere with fingerprint detection.

For example, the first light blocking layer 300 has light transmittance less than 20% for light of a specific band (such as visible light or a band more than 610 nm), to prevent corresponding light from passing. Optionally, a material of the first light blocking layer 300 may be metal or a black opaque material.

Optionally, the optical fingerprint identification apparatus only includes one layer of the first light blocking layer. For example, as shown in FIG. 2, the number of the first light blocking layer 300 is 1; the first light blocking layer 300 includes the first light passing hole 310 corresponding to the first microlens 210; and the microlens 210 is configured to converge the first optical signal from above the first microlens to the first light passing hole 310.

Optionally, the first light passing hole 310 may be a circular hole having a diameter less than 10 μm for optical imaging, and resolution of optical imaging may be improved by reducing a size of the light passing hole, thereby improving resolution of a fingerprint image.

Optionally, a diameter of the first light passing hole 310 is greater than a certain threshold so that sufficient optical signals are passed for imaging, to improve an imaging quality.

Optionally, a shape of the first light passing hole 310 may also be a polygon. An embodiment of the present application does not define the shape of the first light passing hole 310.

It should be understood that a shape and size of each light passing hole on the first light blocking layer 300 may be the same as or different from that of the first light passing hole 310, which is not defined in an embodiment of the present application.

Optionally, as shown in FIG. 2 and FIG. 3, each light passing hole on the first light blocking layer 300 has the same shape and size as that of the first light passing hole 310, positions of the plurality of light passing holes are arranged in an array, and each light passing hole corresponds to a microlens in the first microlens array.

In an embodiment of the present application, the optical signal is transmitted to the light detection array 400 through the plurality of light passing holes of the first light blocking layer 300. The light detection array 400 is configured to receive the optical signal and convert the optical signal into an electrical signal. Optionally, the light detection array processes the electrical signal to obtain a fingerprint image signal.

Optionally, as shown in FIG. 2 and FIG. 3, the light detection array 400 includes a plurality of pixel units, the plurality of pixel units include the first pixel unit 410 corresponding to the first microlens 210, and the first optical signal is transmitted to the first pixel unit 410 through the first light passing hole 310.

Optionally, the first pixel unit 410 is further configured to process the first optical signal to obtain a first fingerprint image electrical signal, which is a unit pixel in the fingerprint image.

Optionally, the first pixel unit 410 may apply devices such as a photo diode, a metal oxide semiconductor field effect transistor (MOSFET). Optionally, the first pixel unit 410 has high light sensitivity and high quantum efficiency for light of a specific wavelength, so as to detect an optical signal of a corresponding wavelength.

Optionally, a shape of the first pixel unit 410 may also be a polygon. An embodiment of the present application does not define the shape of the first pixel unit 410.

It should be understood that a shape and size of each pixel unit on the light detection array 400 may be the same as or different from that of the first pixel unit 410, which is not defined in an embodiment of the present application.

Optionally, as shown in FIG. 2 and FIG. 3, the first pixel unit 410 is a quadrangle; and each pixel unit in the light detection array 400 may be the same as the first pixel unit 410, both are quadrangular and arranged in an array, and each pixel unit corresponds to a microlens in the first microlens array.

Optionally, the light detection array 400 is in a photosensor, the plurality of pixel units are a plurality of pixel units in the photosensor, and specifically, the light detection array 400 may be integrated in a photosensor chip.

In an embodiment of the present application, optionally, an optical center of a first microlens 210, a center of the first light passing hole 310 and a center of the first pixel unit 410 are located on a same perpendicular line perpendicular to the light detection array 400.

Optionally, the first microlens 210 is configured to converge an optical signal above which is perpendicular to the light detection array 400 to the first light passing hole 310.

For example, as shown in FIG. 2, the light detection array 400 and the first pixel unit 410 are located on a parallel plane, the first light blocking layer 300 is disposed in parallel above the light detection array 400, and the first microlens array 200 is disposed in parallel above the first light blocking layer 300. The optical center of the first microlens 210, the center of the first light passing hole 310 and the center of the first pixel unit 410 are all located on a perpendicular line 201, which is a main optical axis of the first microlens array 210.

Optionally, an orthographic projection of the first microlens 210 on the light detection array 400 (for convenience of description, the following orthographic projection of the first microlens 210 on the light detection array 400 is also written as the orthographic projection of the first microlens 210) is the same as a cross section having the largest area of the first microlens 210. For example, as shown in FIG. 3, when upper surface of the first microlens 210 is a spherical surface and lower surface of the first microlens 210 is a quadrangle, the orthographic projection of the first microlens 210 on the light detection array 400 is a quadrangle same as the lower surface. When the optical center of the first microlens 210 and the center of the first pixel unit 410 are located on a same perpendicular line of the light detection array 400, the orthographic projection of the first microlens 210 on the first pixel unit 410 is a quadrangle.

Optionally, a ratio of an area of a projection of the first microlens 210 on the light detection array 400 to an area of the first pixel unit 410 is greater than 70%.

Optionally, a shape of the orthographic projection of the first microlens 210 is different from the shape of the first pixel unit 410. For example, the first microlens 210 is a circular microlens, the first pixel unit 410 is a quadrangle, the orthographic projection of the first microlens 210 is located in the first pixel unit 410, and a ratio of the circular area of the orthographic projection of the first microlens 210 to the area of the first pixel unit 410 is greater than 70%.

Optionally, the shape of the orthographic projection of the first microlens 210 is the same as the shape of the first pixel unit 410. For example, as shown in FIG. 3, the first microlens 210 is a quadrilateral microlens, and the shape of the orthographic projection of the first microlens 210 and the first pixel unit 410 are both the same quadrangle. Optionally, when the optical center of the first microlens 210 is located on a perpendicular line perpendicular to the center of the first pixel unit 410, the shape of the orthographic projection of the first microlens 210 on the light detection array 400 overlaps with the first pixel unit 410, and the ratio of the area of the orthographic projection of the first microlens 210 on the light detection array 400 to the area of the first pixel unit 410 is 100%.

In an embodiment of the present application, optionally, the optical center of the first microlens 210, the center of the first light passing hole 310 and the center of the first pixel unit 410 are located on different perpendicular lines perpendicular to the light detection array 400. In this case, the first microlens 210 converges the optical signal above of a specific direction to the first light passing hole 310, and the optical signal of a specific direction is transmitted to the first pixel unit 410 through the first light passing hole 310 by respectively adjusting relative positions between the first microlens 210, the first light passing hole 310 and the first pixel unit 410.

Optionally, a line direction of the center of the light passing hole 310 and the optical center of the first microlens 210 is similar to or the same as a direction of an optical signal in a first specific direction; and a line direction of the center of the first light passing hole 310 and the center of the first pixel unit 410 is similar to or the same as the direction of the optical signal in the first specific direction.

Figure 4:
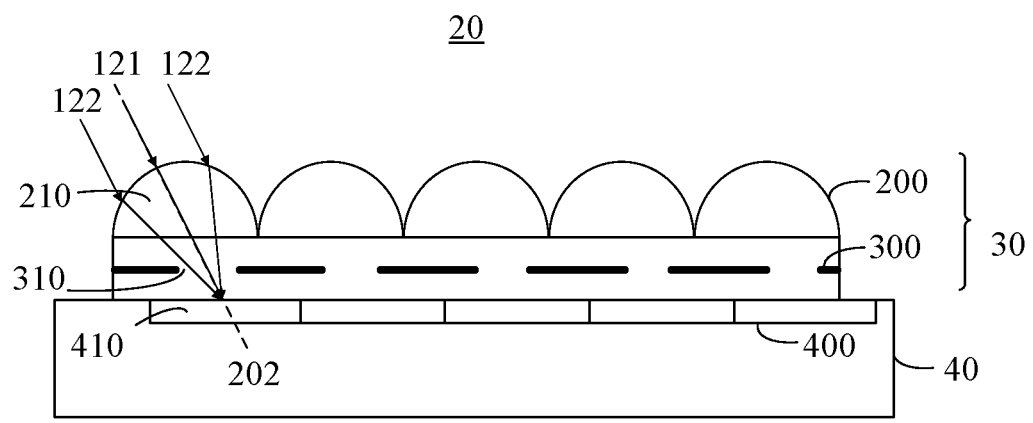
FIG. 4 is another schematic structural diagram of an optical fingerprint identification apparatus provided in an embodiment of the present application.

For example, as shown in FIG. 4, the optical center of the first microlens 210 and the center of the first light passing hole 310 are both located on a straight line 202 in the first specific direction, and the centers of the first light passing hole 310 and the first pixel unit 410 are also located on the straight line 202 in the first specific direction; that is, the first specific direction may be a direction oblique to the light detection array. An optical signal 121 in the first specific direction passing through the optical center of the first microlens 210 is located on the straight line 202 of the first specific direction. The direction of the optical signal formed by the optical signal 122 in the first specific direction after being refracted by the first microlens 210 is similar to the first specific direction, wherein the optical signal 121 in the first specific direction is not passing through the optical center of the first microlens 210. And the optical signal intersects with an optical signal on the straight line 202 in the first specific direction on an image focal plane of the first microlens 210.

Optionally, each microlens in the first microlens array 200 includes a corresponding light passing hole and a pixel unit, and a relative positional relationship between each microlens and the corresponding light passing hole and pixel unit is the same as a relative positional relationship between the first microlens 210 and the corresponding first light passing hole 310 and the first pixel unit 410.

In a technical solution of an embodiment of the present application, the optical signal is converged by the first microlens array 200 to the plurality of light passing holes of the first light blocking layer 300, and the optical signal is transmitted to the light detection array 400 through the plurality of light passing holes of the first light blocking layer 300 for optical fingerprint acquisition. A thickness of the fingerprint identification apparatus is reduced while large-area and high-resolution fingerprint image identification is achieved, thereby improving performance of the optical fingerprint identification apparatus 20.

Figure 5:
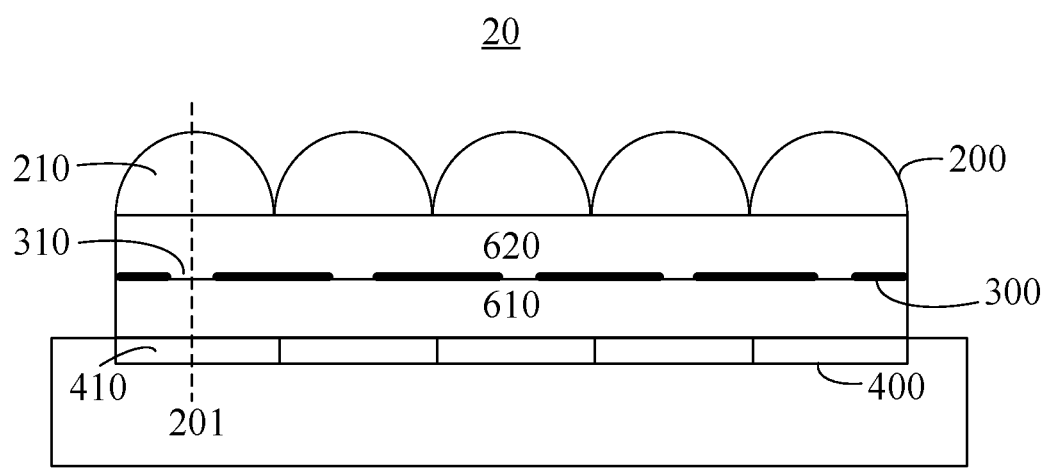
FIG. 5 is another schematic structural diagram of an optical fingerprint identification apparatus provided in an embodiment of the present application.

Optionally, as shown in FIG. 5, the optical fingerprint identification apparatus 20 further includes: a first medium layer 610 and a second medium layer 620;

the first medium layer 610 is grown on a surface of the light detection array 400;

the first light blocking layer 300 is grown on a surface of the first medium layer 610; and the second medium layer 620 is grown on a surface of the first light blocking layer 300 and fills the plurality of light passing holes of the first light blocking layer 300.

Optionally, the first medium layer 610 and the second medium layer 620 may be grown by a semiconductor process, for example, through coating methods such as atomic layer deposition, sputter coating, electron beam evaporation coating, ion beam coating and the like to grow and prepare.

Optionally, the first medium layer 610 and the second medium layer 620 are an organic transparent medium material or inorganic transparent medium material, such as resin or silicon oxide.

Optionally, medium materials of the first medium layer 610 and the second medium layer 620 are same or different.

Optionally, the first light blocking layer 300, the first medium layer 610 and the second medium layer 620 are all integrated with the light detection array 400 in the photosensor. For example, both the first medium layer 610 and the second medium layer 620 are silicon oxide. First, the first medium layer 610 is formed by coating above a plurality of pixel units of the photosensor. Then, the first light blocking layer 300 is prepared above the first medium layer 610. Next, the second medium layer 620 is prepared above the first light blocking layer 300.

Optionally, the first light blocking layer 300, the first medium layer 610 and the light detection array 400 are integrated in the photosensor, and the second medium layer 620 is grown on a surface of the photosensor. For example, the first medium layer 610 is silicon oxide and the second medium layer 620 is resin.

Optionally, the optical fingerprint identification apparatus includes a plurality of layers of the first light blocking layer.

Figure 6:
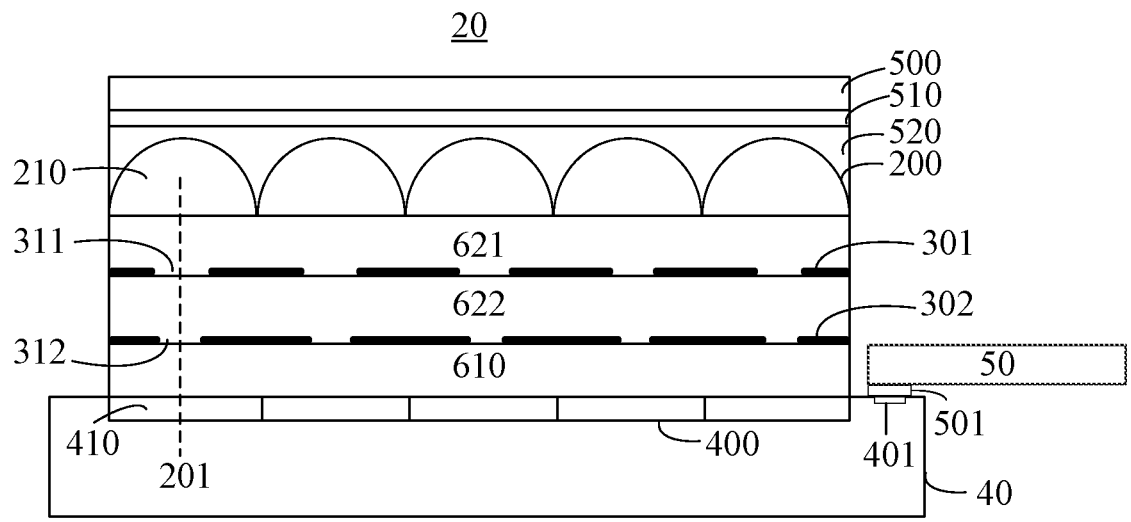
FIG. 6 is another schematic structural diagram of an optical fingerprint identification apparatus provided in an embodiment of the present application.

For example, as shown in FIG. 6, the optical fingerprint identification apparatus 20 includes two layers of the first light blocking layer 300, where the first light blocking layer on the top is a first upper light blocking layer 301, and the first light blocking layer on the bottom is a first lower light blocking layer 302.

Optionally, the second medium layer is disposed both between the plurality of the first light blocking layers and between the first light blocking layer disposed on a topmost layer and the first microlens array, and the first light blocking layer and the second medium layer are sequentially grown by a growth process; and the second medium layer fills the plurality of light passing hole of the first light blocking layer.

Optionally, as shown in FIG. 6, the first medium layer 610 is grown on the light detection array 400, the second medium layer 620 includes a second upper medium layer 621 and a second lower medium layer 622. The second upper medium layer 621 is disposed between the first microlens array 200 and the first upper light blocking layer 301, and in light passing holes of the first upper light blocking layer 301; and the second lower medium layer 622 is disposed between the first upper light blocking layer 301 and the first lower light blocking layer 302, and in light passing holes of the first lower light blocking layer 302.

Optionally, the diameter of the light passing holes of the first light blocking layer on the upper layer is greater than the diameter of the light passing holes of the first light blocking layer on the lower layer. For example, as shown in FIG. 6, the diameter of the light passing holes of the first upper light blocking layer 301 is greater than the diameter of the light passing holes of the first lower light blocking layer 302.

Optionally, the optical signal is an optical signal in a second specific direction, a line direction of a center of the light passing hole of the first light blocking layer on the upper layer and a center of the corresponding light passing hole of the first light blocking layer on the lower layer is the same as or similar to the second specific direction; and a line direction of the center of the first light passing hole on the upper layer and a center of corresponding the pixel unit on the light detection array is the same as or similar to the second specific direction.

Optionally, the second specific direction is a direction perpendicular to the light detection array. For example, as shown in FIG. 6, the light passing hole of the first upper light blocking layer 301 is located directly above the corresponding light passing hole of the first lower light blocking layer 302, and the light passing hole of the first lower light blocking layer 302 is located directly above a corresponding pixel unit of the light detection array 400. Both the light passing holes of the first upper light blocking layer 301 and the light passing holes of the first lower light blocking layer 302 are configured to receive an optical signal perpendicular to the light detection array.

Optionally, a plurality of light passing holes of the first upper light blocking layer 301 include a first upper light passing hole 311, and a plurality of light passing holes of the first lower light blocking layer 302 include a first lower light passing hole 312 corresponding to the first upper light passing hole.

Optionally, in an embodiment of the present application, the above first light passing hole 310 may include the first upper light passing hole 311 and the first lower light passing hole 312. The first upper light passing hole 311 and the first lower light passing hole 312 correspond to the first microlens 210 and the first pixel unit 410.

Specifically, the first microlens 210 transmits a first optical signal from above the first microlens 210 to the first upper light passing hole 311 and the first lower light passing hole 312, and the first optical signal is transmitted to the first pixel unit 410 through the first upper light passing hole 311 and the first lower light passing hole 312.

Optionally, a focus of the first microlens 210 is located between the first light blocking layer on the bottom and the light detection array. For example, the focus of the first microlens 210 is located at any point between the first lower light blocking layer 302 and the first pixel unit 410.

Specifically, the focus of the first microlens 210 may be located on the first pixel unit 410 or in the first lower light passing hole 312.

Optionally, a diameter of the first upper light blocking layer 311 is greater than that of the first lower light blocking layer 312.

Optionally, the first upper light passing hole 311 and the first lower light passing hole 322 are circular holes having a diameter less than 10 μm for optical imaging. Optionally, the diameters of the first upper light passing hole 311 and the first lower light passing hole 322 are greater than a certain threshold.

Optionally, shapes of the first upper light passing hole 311 and the first lower light passing hole 322 may also be polygons, which is not defined in an embodiment of the present application.

Optionally, as shown in FIG. 6, an optical center of the first microlens 210, a center of the first upper light passing hole 311, a center of the first lower light passing hole 312 and a center of the first pixel unit 410 are all located on a same perpendicular line of the light detection array 400. In this case, the first microlens 210 converges the first optical signal above which is perpendicular to the light detection array 400 to the first upper light passing hole 311 or the first lower light passing hole 312, and the first optical signal perpendicular to the light detection array 400 is transmitted to the first pixel unit 410 through the first upper light passing hole 311 and the first lower light passing hole 312.

Optionally, the optical center of the first microlens 210, the center of the first upper light passing hole 311, the center of the first lower light passing 312 and the center of the first pixel unit 410 are located on different perpendicular lines of the light detection array 400. In this case, by respectively adjusting relative positions between the first microlens 210, the first upper light passing hole 311 and the first lower light passing hole 312 and the first pixel unit 410, the first microlens 210 converges an optical signal above in the second specific direction to the first lower light passing hole 312, and the optical signal in the second specific direction is transmitted to the first pixel unit 410 through the first upper light passing hole 311 and the first lower light passing hole 312.

Optionally, each light passing hole of the first upper light blocking layer 301 has the same shape and size as that of the first upper light passing hole 311, and each light passing hole of the first lower light blocking layer 302 has the same shape and size as that of the first lower light passing hole 312.

Optionally, a relative positional relationship between each light passing hole of the first upper light blocking layer 301 and the corresponding light passing hole of the first lower light blocking layer 302 is the same as a relative positional relationship between the first upper light passing hole 311 and the first lower light passing hole 312.

It should be understood that a shape of the first upper light passing hole 311 may be the same as or different from a shape of the first lower light passing hole 312, which is not defined in an embodiment of the present application.

It should be understood that although a design of a two-layer light blocking layer is described above as an example, the two-layer light blocking layer is not limited to a technical solution of an embodiment of the present application. For the case of the light blocking layer with more than two layers, the design of the two-layer light blocking layer described above may be used between every two layers of the light blocking layers.

In an embodiment of the present application, through a multi-layer light blocking layer and the light passing hole, it may further facilitate achieving acquisition and imaging of light in a specific direction, and further block ambient light or other interference optical signals in non-specific directions, thereby improving an imaging quality.

Optionally, the optical fingerprint identification apparatus 20 further includes:

a filter layer 500 for filtering out an optical signal of a non-target band, and transmitting an optical signal of a target band (that is, an optical signal of a required band for fingerprint image acquisition).

Optionally, the filter layer 500 is disposed above the first microlens array 200. For example, as shown in FIG. 6, a buffer layer 520 is disposed above the first microlens array 200, and the buffer layer 520 is a transparent medium buffer layer having an optical refractive index lower than that of the first lens array 200. Optionally, the buffer layer 520 has an optical refractive index less than 1.3. A lower surface of the filter layer 500 is exactly attached to an upper surface of the buffer layer 520 through an adhesive layer 510. Optionally, the adhesive layer 510 may be a low refractive index adhesive having a refractive index less than 1.25.

Optionally, the filter layer 500 may also be fixed above the first microlens array 200 by a fixing apparatus. For example, a sealant or other supporting members are disposed on a non-photosensitive region around the first microlens array 200, to support and fix the filter layer 500 above the first microlens array. There is an air gap layer between the lower surface of the filter layer 500 and the upper surface of the first microlens array 200.

Figure 7:
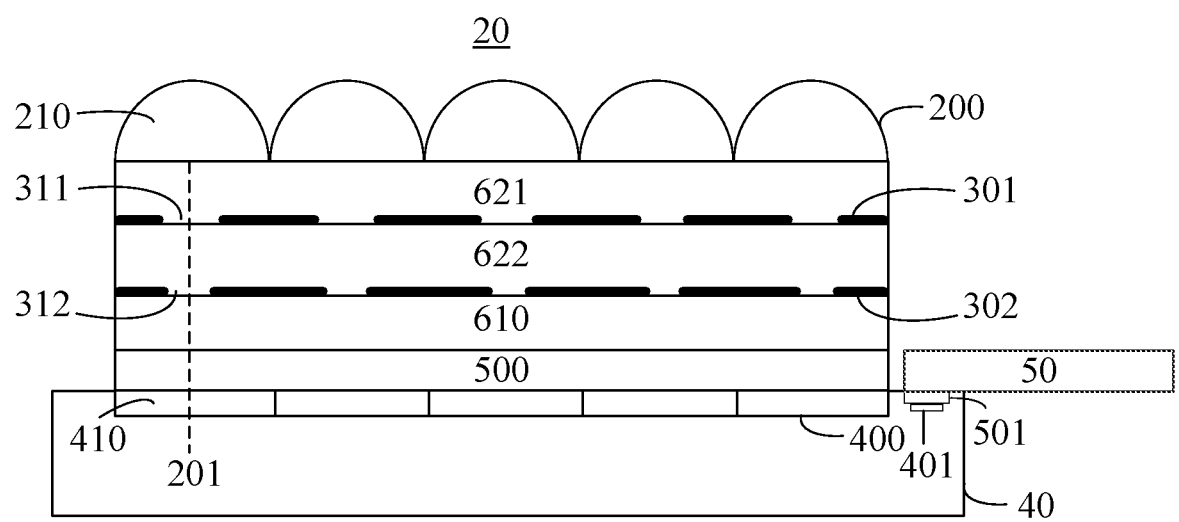
FIG. 7 is another schematic structural diagram of an optical fingerprint identification apparatus provided in an embodiment of the present application.

Optionally, the filter layer 500 may also be disposed in an optical path between the first microlens array 200 to the light detection array 400. Specifically, the filter layer 500 may be disposed between the first light blocking layer 300 and the light detection array 400. For example, as shown in FIG. 7, the first light blocking layer 300 is formed above the filter layer 500, and the filter layer 500 is disposed above the light detection array 400. It may be understood that when the filter layer 500 is disposed between the first light blocking layer 300 and the light detection array 400, the first medium layer 610 may be grown on a surface of the filter layer 500.

Optionally, the filter layer 500 may be integrated with the light detection array 400 in the photosensor chip. Specifically, evaporation process may be applied to perform coating on the plurality of pixel units of the photosensor to form the filter array 500. For example, a layer of film of a filter material is prepared above the plurality of pixel units of the photosensor through methods such as atomic layer deposition, sputter coating, electron beam evaporation coating, ion beam coating and the like. In the technical solution, a thickness of the filter layer 500 is less than or equal to 20 μm.

Optionally, the filter layer 500 is an optical wavelength cut filter for filtering out an optical signal of a specific band, which facilitates reducing influence of an ambient light signal of a specific band, thereby improving fingerprint recognition performance.

Optionally, the filter layer 500 is configured to pass optical signals in the range of 350 to 700 nm.

Optionally, the filter layer 500 can also be configured to pass optical signals in the range of 800 to 1000 nm.

Optionally, the filter layer 500 can be configured to pass optical signals in the range of 350 to 700 nm and 800 to 1000 nm simultaneously.

Optionally, as shown in FIG. 6 and FIG. 7, the optical fingerprint identification apparatus 20 further includes:

a circuit board 50 electrically connected with the optical fingerprint identification apparatus 20 through an electrical connection apparatus 501.

Optionally, an optical inspection portion 40 of the optical fingerprint identification apparatus 20 is provided with a metal pad 401; and the electrical connection apparatus 501 is electrically connected with the optical fingerprint identification apparatus 20 through the metal pad 401.

Optionally, in a possible implementation, as shown in FIG. 6 and FIG. 7, the circuit board 50 may be a flexible circuit board (FPC), and the electrical connection apparatus 501 may be a solder, an anisotropic conductive film (ACF) or other metal connection apparatuses.

Optionally, in a possible implementation, the circuit board 50 may also be a printed circuit board (PCB), and the electrical connection apparatus 501 may be a wire bonding (WB) apparatus. For example, the electrical connection apparatus 501 may be a bonding wire of Au. The printed circuit board 50 may be disposed below the optical inspection portion 40, or parallel with the optical inspection portion 40.

Optionally, the circuit board 50 may be the circuit board 150 in FIG. 1.

It should be understood that the electrical connection apparatus 501 may also be a micro metal connection post, a connector or other electrical connection manners. The electrical connection device 501 is not limited to the embodiment of the present application as long as the electrical connection between the circuit board 50 and the optical fingerprint device 20 can be realized.

Optionally, the optical fingerprint identification apparatus 20 further includes: a microlens array component 700 disposed above the first microlens array 200, and configured to converge the optical signal to the first microlens array 200.

Figure 8:
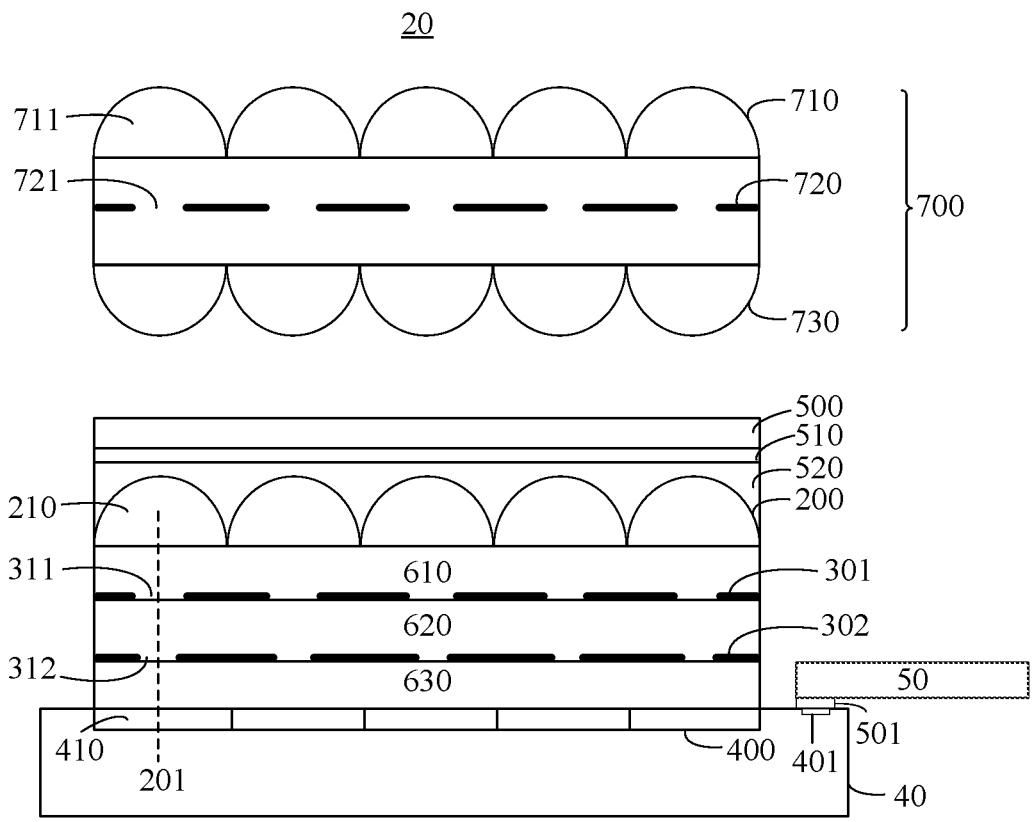
FIG. 8 is another schematic structural diagram of an optical fingerprint identification apparatus provided in an embodiment of the present application.

Optionally, as shown in FIG. 8, the microlens array component 700 includes:

a second microlens array 710; and a second light blocking layer 720 disposed between the second microlens array 710 and the first microlens 200, where the second light blocking layer 720 is provided with a plurality of light passing holes, where the second microlens array 710 is configured to converge the optical signal to the plurality of light passing holes of the second light blocking layer, and the optical signal is transmitted to the light detection array 200 through the plurality of light passing holes of the second light blocking layer.

Optically, an upper surface of the second microlens array 710 is a light-converging region, and the light-converging region covers a photosensitive area of the light detection array.

Figure 9:
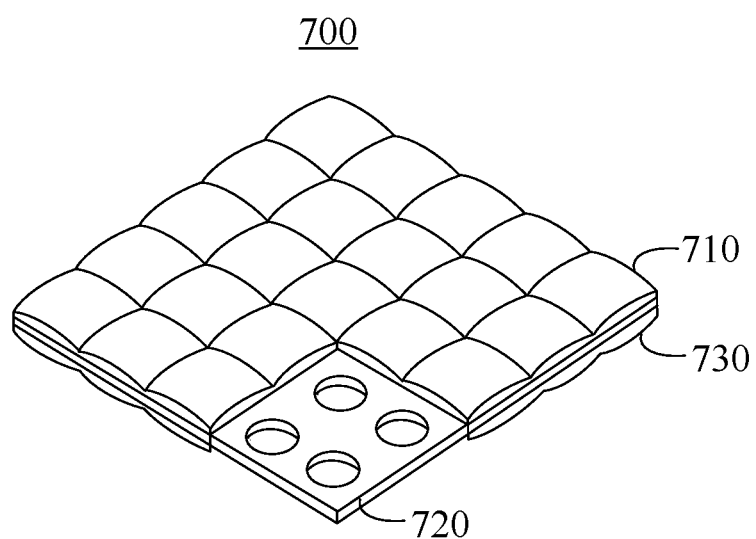
FIG. 9 is a schematic multi-layered stereoscopic structural diagram of a microlens array component in an optical fingerprint identification apparatus provided in an embodiment of the present application.

FIG. 9 is a schematic multi-layered stereoscopic diagram of a microlens array component 700 in the optical fingerprint identification apparatus. As shown in FIG. 9, an upper surface of the second microlens array 710 is an array spliced by a plurality of spherical or aspherical surfaces. All regions are curved surfaces and do not include a plane. All regions of the upper surface of the second microlens array 710 may converge light.

Optionally, the second microlens array 710 includes a plurality of microlenses, where a second microlens 711 of the plurality of microlenses of the second microlens array 710 is configured to converge a second optical signal from above the second microlens 711 to a second light passing hole 721 corresponding to the second microlens in the plurality of light passing holes of the second light blocking layer 720, and the second optical signal is transmitted to a microlens corresponding to the second microlens 711 in the first microlens array 200 through the second light passing hole 721.

Optionally, the microlens corresponding to the second microlens 711 in the first microlens array 710 may be the above first microlens 210, and the second optical signal includes the above first optical signal.

Optionally, the second microlens 711 may be configured to converge the second optical signal above which is perpendicular to the light detection array 400 to the second light passing hole 721.

Optionally, a focus of the second microlens 711 is located in the second light passing hole 721.

Optionally, the second microlens 711 may also be configured to converge the second optical signal above in a specific direction to the second light passing hole 721.

Optionally, a surface of the second microlens 711 may be a spherical surface or an aspherical surface.

Optionally, the second microlens 711 is a polygonal lens, such as a square lens or a hexagonal lens. Optically, the second microlens 711 may also be a circular lens. As shown in FIG. 8 and FIG. 9, the second microlens 711 is a quadrangular lens whose upper surface is a spherical surface and whose lower surface is a quadrangle.

Optionally, a material of the second microlens array 710 is a transparent medium with light transmittance greater than 99%, such as a resin and the like.

It should be understood that the second microlens 711 is any one of a plurality of microlenses in the second microlens array 710. An embodiment of the present application does not define the specific location where the second microlens 711 is located in the second microlens array 710.

It should be understood that a shape and size of the plurality of microlenses in the second microlens array 710 may be the same as or different from that of the second microlenses 711. An embodiment of the present application does not define the shape and size of the plurality of microlenses.

Optionally, each microlens of the plurality of microlenses in the second microlens array 710 is the same as the second microlens 711. As shown in FIG. 8 and FIG. 9; each microlens in the second microlens array 710 is a quadrangular microlens; and a plurality of the quadrangular microlenses are arranged in an array on a horizontal plane. In addition, each microlens in the second microlens array 710 may also be a circular microlens or other polygonal microlenses.

In an embodiment of the present application, the optical signal may be transmitted to the first microlens array 200 through the plurality of light passing holes of the second light blocking layer 720. The second light blocking layer 720 is configured to further block ambient light, stray light and other optical signals which interfere with fingerprint detection.

Optionally, a material of the second light blocking layer 720 may be metal or a black opaque material.

Optionally, the number of the second light blocking layer 720 is greater than or equal to 1. For example, as shown in FIG. 7, the number of the second light blocking layer 720 is 1; the second light blocking layer 720 includes the second light passing hole 721 corresponding to the second microlens 711; and the second microlens 711 is configured to converge the second optical signal from above the second microlens to the second light passing hole 721.

Optionally, the second upper light passing hole 721 may be a circular hole having a diameter less than 10 μm. Optionally, a diameter of the second light passing hole 721 is greater than a certain threshold so that sufficient optical signals are passed for imaging, to improve imaging quality.

Optionally, a shape of the second light passing hole 721 may also be a polygon. An embodiment of the present application does not define the shape of the second light passing hole 721.

It should be understood that a shape and size of each second light passing hole on the second light blocking layer 720 may be the same as or different from that of the second light passing hole 721, which is not defined in an embodiment of the present application.

Optionally, as shown in FIG. 8 and FIG. 9, each second light passing hole on the second light blocking layer 720 has the same shape and size as the second light passing hole 721, positions of the plurality of the second light passing holes are arranged in an array, and each second light passing hole corresponds to a second microlens.

In an embodiment of the present application, optionally, an optical center of a second microlens 711 and a center of the second light passing hole 721 are located on a same perpendicular line of the light detection array 400. Optionally, the center of the first pixel unit 410 is also located on the same perpendicular line.

In this case, the second microlens 711 is configured to converge the second optical signal above which is perpendicular to the light detection array 400 to the second light passing hole 721.

For example, as shown in FIG. 8, the light detection array 400 and the first pixel unit 410 are located on a parallel plane, the second light blocking layer 720 is disposed in parallel above the light detection array 400, and the second microlens array 710 is disposed in parallel above the second light blocking layer 720. An optical center of the second microlens 711, and centers of the second light passing hole 721 and first pixel unit 410 are all located on the perpendicular line 201.

Optionally, an orthographic projection of the second microlens 711 on the light detection array 400 (for convenience of description, the following orthographic projection of the second microlens 711 on the light detection array 400 is also written as the orthographic projection of the second microlens 711) is the same as a cross section having the largest area of the second microlens 711. For example, as shown in FIG. 9, when upper surface of the second microlens 711 is a spherical surface and lower surface of the first microlens 210 is a quadrangle, the orthographic projection of the second microlens 711 on the light detection array 400 is a quadrangle same as the lower surface. When the optical center of the second microlens 711 and the center of the first pixel unit 410 are located on a same perpendicular line of the light detection array 400, the orthographic projection of the second microlens 711 on the first pixel unit 410 is a quadrangle.

Optionally, an area of the orthographic projection of the second microlens 711 on the light detection array 400 is greater than or equal to an area of a corresponding pixel unit of the second microlens 711 in the light detection array 400.

Optionally, the orthographic projection of the second microlens 711 on the light detection array 400 overlaps with the corresponding pixel unit of the second microlens 711 in the light detection array 400.

For example, as shown in FIG. 8, the area of the orthographic projection of the second microlens 711 on the light detection array 400 is greater than the area of the first pixel unit 410.

Optionally, a shape of the orthographic projection of the second microlens 711 is the same as the shape of the first pixel unit 410. For example, as shown in FIG. 9, the second microlens 711 is a quadrilateral microlens, and the shape of the orthographic projection of the second microlens 711 and the first pixel unit 410 are both the same quadrangle. Optionally, when the optical center of the second microlens 711 is located on a perpendicular line perpendicular to the center of the first pixel unit 410, the shape of the orthographic projection of the second microlens 711 on the light detection array 400 overlaps with the first pixel unit 410.

Optionally, each microlens in the second microlens array 710 includes a corresponding light passing hole, and a relative positional relationship between each microlens and the corresponding light passing hole is the same as a relative positional relationship between the second microlens 711 and the corresponding second light passing hole 721.

Optionally, the second microlens array 710 is exactly the same as the first microlens array 200. Specifically, each microlens in the second microlens array 710 is exactly the same as a corresponding microlens in the first microlens array 200; and a relative positional relationship between the plurality of microlenses in the second microlens array 710 and a relative positional relationship between the plurality of the microlenses in the first microlens array 200 is the same.

Optionally, the microlens array component 700 further includes a third microlens array 730.

Optionally, as shown in FIG. 8, the third microlens array 730 is disposed between the second light blocking layer 720 and the first microlens array 200.

Optionally, as shown in FIG. 9, the first microlens array 730 is exactly the same as the second microlens array 710. The first microlens array 730 and the second microlens array 710 are mirrored disposed on both sides of the second light blocking layer 720.

As shown in FIG. 9, a lower surface of the third microlens array 730 is an array spliced by a plurality of spherical or aspherical surfaces. All regions are curved surfaces and do not include a plane. All regions of the lower surface of the third microlens array 730 may converge light.

In an embodiment of the present application, a microlens array assembly 700 is further added to the optical fingerprint identification apparatus 20 to converge the optical signal for multiple times, which may increase intensity of the optical signal received by the light detection array and improve the quality of the optical fingerprint image.

It should be understood that the optical fingerprint identification apparatus 20 may further include a supporting structure component for supporting the optical fingerprint identification apparatus 20, and a corresponding processing chip and the like, which are not defined in an embodiment of the present application.

Figure 10:
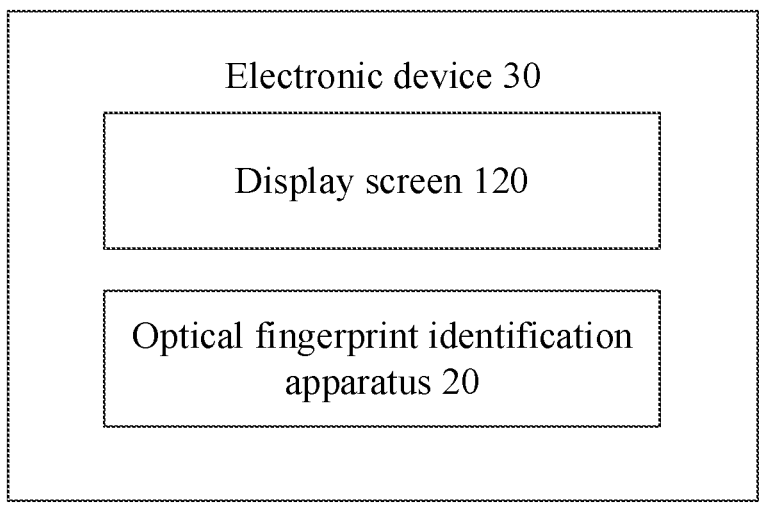
FIG. 10 is a schematic block diagram of an electronic device according to an embodiment of the present application.

As shown in FIG. 10, an embodiment of the present application further provides an electronic device 30, and the electronic device 30 may include the above display screen 120 and the above optical fingerprint identification apparatus 20 of the embodiments of the present application, where the optical fingerprint identification apparatus 20 is disposed below the display screen 120.

The electronic device may be an electronic device with a display screen.

It should be noted that specific examples in embodiments of the present application are just for helping those skilled in the art better understand the embodiments of the present application, rather than for limiting the scope of the present application.

It should also be noted that terms used in embodiments of the present application and the claims appended hereto are merely for the purpose of describing particular embodiments, and are not intended to limit the embodiments of the present application. For example, the use of a singular form of "a", "the above" and "the" in the embodiments of the present application and the claims appended hereto are also intended to include a plural form, unless otherwise clearly indicated herein by context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are performed by hardware or software depends on particular applications and designed constraint conditions of the technical solutions. Persons skilled in the art may use different methods to implement the described functions for every particular application, but it should not be considered that such implementation goes beyond the scope of the present application.

In the several embodiments provided in the present application, it should be understood that, the disclosed system and apparatus may be implemented in other manners. For example, the described apparatus embodiment is merely an example. For example, the unit division is merely logical function division and may be other division in actual implementation. For example, a plurality of units or components may be combined or integrated in another system, or some features may be ignored or not performed. In addition, the displayed or discussed mutual coupling or direct coupling or communication connection may be indirect coupling or communication connection through some interfaces, apparatuses or units, and may also be electrical, mechanical, or connection in other forms.

The units described as separate parts may or may not be physically separate, and parts displayed as units may or may not be physical units, may be located in one position, or may be distributed on multiple network units. Part of or all of the units here may be selected according to a practical need to achieve the objectives of the solutions of the embodiments of the present application.

In addition, functional units in the embodiments of the present application may be integrated in a processing unit, or each unit may exist alone physically, or two or more than two units may be integrated in one unit. The integrated unit may be implemented in a form of hardware, or may be implemented in a form of a software functional unit.

If being implemented in the form of a software functional unit and sold or used as a separate product, the integrated unit may be stored in a computer-readable storage medium. Based on such understanding, the nature of the technical solutions of the present application, or the part contributing to the prior art, or all of or part of the technical solutions may be implemented in a form of software product. The computer software product is stored in a storage medium and includes several instructions for instructing a computer device (which may be a personal computer, a server, or a network device, and the like) to execute all of or part of the steps of the method described in the embodiments of the present application. The foregoing storage medium includes a variety of media capable of storing program codes, such as a USB disk, a mobile hard disk, a read-only memory (ROM), a random access memory (RAM), a magnetic disk, an optical disk.

The foregoing description is only a specific implementation manner of the present application. The protection scope of the present application, however, is not limited thereto. Various modifications or replacements may be readily conceivable to any person skilled in the art within the technical scope disclosed in the present application, and such modifications or replacements shall fall within the protection scope of the present application. Therefore, the protection scope of the present application shall be subject to the protection scope of the claims.

What is claimed is:

1. An optical fingerprint identification apparatus, comprising:
   a light detection array;
   a filter layer, disposed above the light detection array, for filtering out an optical signal of a non-target band, and transmitting an optical signal of a target band, wherein the filter layer is integrated with the light detection array in a photosensor chip;

a first light blocking layer formed above the filter layer, wherein the first light blocking layer is provided with a plurality of light passing holes; and a first microlens array disposed above the first light blocking layer, wherein the first microlens array is configured to converge an optical signal to the plurality of light passing holes of the first light blocking layer, and the optical signal is transmitted to the light detection array through the plurality of light passing holes of the first light blocking layer;

wherein the optical fingerprint identification apparatus further comprises: a first medium layer and a second medium layer;

the first medium layer is disposed on a surface of the filter layer;

the first light blocking layer is disposed on a surface of the first medium layer; and the second medium layer is disposed on a surface of the first light blocking layer and fills the plurality of light passing holes of the first light blocking layer.

2. The optical fingerprint identification apparatus according to claim 1, wherein the optical fingerprint identification apparatus comprises a plurality of layers of the first light blocking layer.

3. The optical fingerprint identification apparatus according to claim 2, wherein the second medium layer is disposed both between the plurality of layers of the first light blocking layer and between the first light blocking layer disposed on a topmost layer and the first microlens array; and the second medium layer fills the plurality of light passing holes of the first light blocking layer.

4. The optical fingerprint identification apparatus according to claim 2, wherein a diameter of the light passing hole of the first light blocking layer on an upper layer is greater than a diameter of the light passing hole of the first light blocking layer on a lower layer.

5. The optical fingerprint identification apparatus according to claim 2, wherein the optical signal is an optical signal in a second specific direction, a line direction of a center of a light passing hole of the first light blocking layer on the upper layer and a center of a corresponding light passing hole of the first light blocking layer on the lower layer is the same as or similar to the second specific direction; and a line direction of the center of a light passing hole of the first light blocking layer on the upper layer and a center of a corresponding pixel unit in the light detection array is the same as or similar to the second specific direction.

6. The optical fingerprint identification apparatus according to claim 1, wherein the first microlens array comprises a plurality of microlenses, and the light detection array comprises a plurality of pixel units, wherein a first microlens in the plurality of microlenses of the first microlens array is configured to converge a first optical signal from above the first microlens to a first light passing hole corresponding to the first microlens in light passing holes of the first light blocking layer, and the first optical signal is transmitted to a first pixel unit corresponding to the first microlens in the plurality of pixel units through the first light passing hole.

7. The optical fingerprint identification apparatus according to claim 6, wherein the optical signal is an optical signal in a first specific direction, a line direction of an optical center of the first microlens and a center of the first light passing hole is the same as or similar to the first specific direction, and a line direction of the center of the first light passing hole and a center of the first pixel unit is the same as or similar to the first specific direction.

8. The optical fingerprint identification apparatus according to claim 7, wherein the first specific direction is perpendicular to the light detection array, or the first specific direction is oblique to the light detection array.

9. The optical fingerprint identification apparatus according to claim 6, wherein a ratio of an area of an orthographic projection of the first microlens on the light detection array to an area of the first pixel unit is greater than 70%.

10. The optical fingerprint identification apparatus according to claim 6, wherein the first microlens is a quadrangular microlens.

11. The optical fingerprint identification apparatus according to claim 6, wherein an upper surface of the first microlens is a spherical surface or an aspherical surface.

12. The optical fingerprint identification apparatus according to claim 1, wherein the light passing hole is a circular hole having a diameter less than 10 µm.

13. The optical fingerprint identification apparatus according to claim 1, wherein a wavelength range of the target band comprises 350 to 700 nm and/or 800 to 1000 nm.

14. The optical fingerprint identification apparatus according to claim 1, wherein a thickness of the filter layer is smaller than or equal to 20 µm.

15. The optical fingerprint identification apparatus according to claim 1, wherein the optical fingerprint identification apparatus further comprises a circuit board electrically connected with a light detection portion of the optical fingerprint identification apparatus through an electrical connection apparatus.

16. The optical fingerprint identification apparatus according to claim 15, wherein the circuit board is a flexible circuit board, and the electrical connection apparatus is a solder, an anisotropic conductive film or a metal connection apparatus.

17. The optical fingerprint identification apparatus according to claim 15, wherein the circuit board is a printed circuit board, and the electrical connection apparatus is a wire bonding apparatus.

18. The optical fingerprint identification apparatus according to claim 15, wherein the printed circuit board is disposed below the light detection portion, or parallel with the light detection portion.

19. The optical fingerprint identification apparatus according to claim 1, the filter layer is a layer of film of a filter material is prepared above the plurality of pixel units of the light detection array, a thickness of the filter layer is less than or equal to 20 µm.

20. An electronic device, wherein it comprises: a display screen, and an optical fingerprint identification apparatus, wherein the optical fingerprint identification apparatus is disposed below the display screen, and the optical fingerprint identification apparatus comprises:

a light detection array;

a filter layer, disposed above the light detection array, for filtering out an optical signal of a non-target band, and transmitting an optical signal of a target band, wherein the filter layer is integrated with the light detection array in a photosensor chip;

a first light blocking layer formed above the filter layer, wherein the first light blocking layer is provided with a plurality of light passing holes; and a first microlens array disposed above the first light blocking layer, wherein the first microlens array is configured to converge an optical signal to the plurality of light passing holes of the first light blocking layer, and the optical signal is transmitted to the light detection array through the plurality of light passing holes of the first light blocking layer;

wherein the optical fingerprint identification apparatus further comprises: a first medium layer and a second medium layer;

the first medium layer is disposed on a surface of the filter layer;

the first light blocking layer is disposed on a surface of the first medium layer; and the second medium layer is disposed on a surface of the first light blocking layer and fills the plurality of light passing holes of the first light blocking layer.

\* \* \* \* \*